Dec. 11, 1962 W. T. DUERDOTH 3,068,421

TRANSISTORIZED PULSE MODULATION CONVERTER AND DEMODULATOR

Filed Oct. 26, 1959 2 Sheets-Sheet 1

WINSTON T. DUERDOTH
INVENTOR

BY Hall & Houghton

ATTORNEY

WINSTON T. DUERDOTH,
INVENTOR

BY Hall & Houghton
ATTORNEY

United States Patent Office 3,068,421
Patented Dec. 11, 1962

3,068,421

TRANSISTORIZED PULSE MODULATION CONVERTER AND DEMODULATOR

Winston Theodore Duerdoth, Ruislip, England, assignor to Her Majesty's Postmaster General, London, England Filed Oct. 26, 1959, Ser. No. 848,713
Claims priority, application Great Britain Oct. 28, 1958
6 Claims. (Cl. 329—109)

The present invention relates to electrical circuits including transistors and is particularly, although not exclusively, concerned with the use of such circuits in pulse communication systems.

The invention is described particularly in relation to a circuit in which amplitude modulated pulses are converted into length (or width) modulated pulses. Also described are circuit arrangements whereby such length modulated pulses may be demodulated.

It is an object of the present invention to provide an improved form of such circuits.

According to the present invention a circuit for converting amplitude modulated pulses into length modulated pulses comprises a transistor having an inductor connected between its base electrode and its emitter electrode, and to which, in use of the circuit, amplitude modulated input pulses are applied, the collector circuit of the transistor including a load impedance of such magnitude that for a period subsequent to the cessation of an input pulse the transistor assumes a bottomed condition, the duration of this period being dependent upon the amplitude of said input pulse.

The collector load impedance may conveniently comprise a resistor but preferably this impedance will be inductive.

The invention may be utilised, in one form, in the construction of a circuit for demodulating amplitude modulated pulses which circuit comprises a transistor having an inductor connected between its base electrode and its emitter electrode, and to which, in use of the circuit, amplitude modulated input pulses are applied, the collector load of the transistor comprising a low pass filter circuit having a series connected inductor as its first element, the characteristic impedance of the filter being of such magnitude that for a period subsequent to the cessation of an input pulse the transistor assumes a bottomed condition, the length of this period being dependent upon the amplitude of said input pulse, a rectifier connected across the input terminals of the filter in such manner that, in operation of the circuit, when the transistor is in a cut-off condition the rectifier forms a low impedance input termination of the filter, and terminating the output section of said filter an impedance equal to the characteristic impedance of the filter.

In an alternative form of demodulator a circuit according to the invention for converting amplitude modulated pulses into length modulated pulses may have its load impedance coupled to a pulse amplifying circuit, a low pass filter for demodulating said amplified length modulated signals being connected to the output of said amplifying circuit.

Preferably, the inductor connected between the base electrode and the emitter electrode of the transistor is a secondary winding of a transformer, input pulses being applied, in use of the circuit, to a primary winding of this transformer. Advantageously, the emitter circuit of the transistor may include a stabilising resistor.

Figure 1:
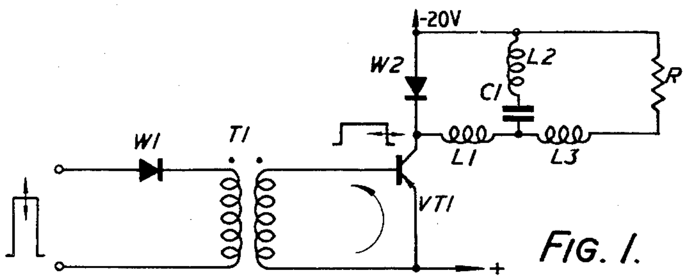
Figure 2:
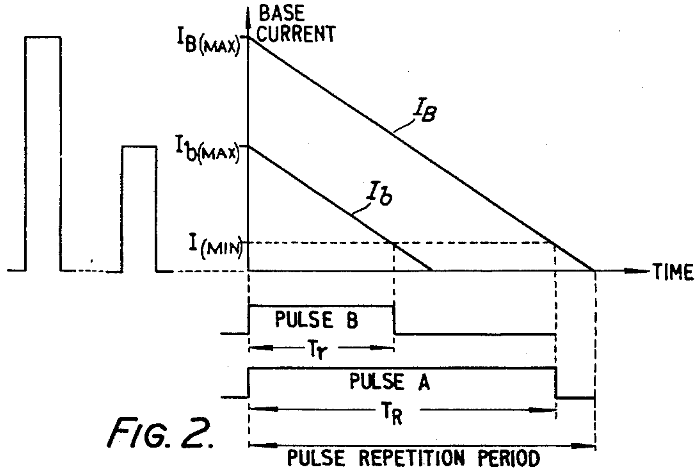
Figure 3:
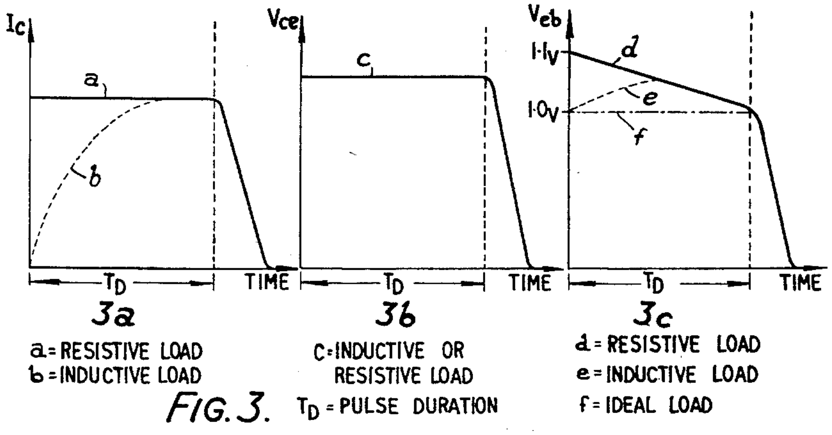

A basic form of circuit according to the invention will now be described by way of example, as will demodulator circuits embodying the invention and suitable for use in a time division multiplex (t.d.m.) telephone exchange. In the ensuing description reference will be made to the accompanying drawings in which, FIG. 1 shows the circuit diagram of a demodulator, FIG. 2 illustrates the conversion of amplitude modulated pulses into length modulated pulses, FIG. 3 shows curves relating to a transistor used in circuits according to the invention, FIG. 4 shows a circuit for converting amplitude modulated pulses into length modulated pulses, and FIG. 5 shows the circuit of an alternative form of demodulator.

Figure 4:
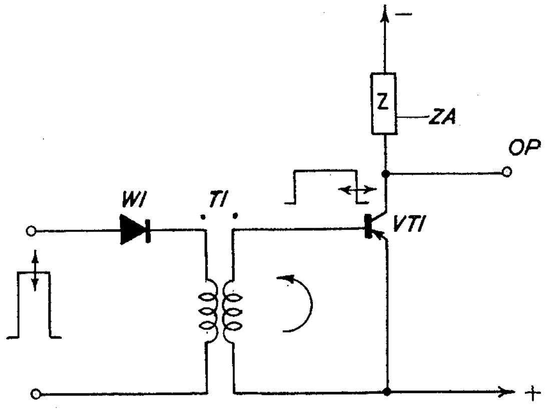
Figure 5:
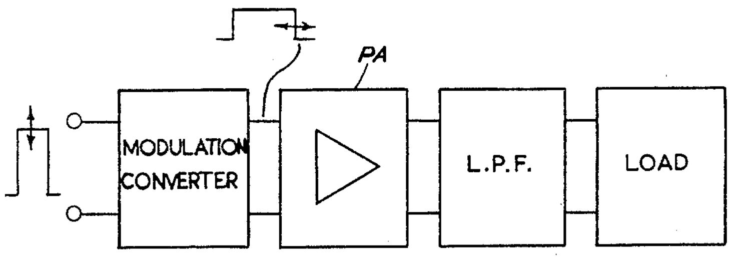

FIGURE 4 shows a circuit comprising transistor VT1 having connected across its base and emitter electrodes the secondary winding of transformer T1. Transformer T1 also has a primary winding to which input pulses are applied via rectifier W1. Transistor VT1 is biased as shown and has as its collector load impedance ZA, across which output signals are developed.

The circuit shown in FIG. 4 uses only one transistor, VT1. This transistor is used as a switch, being cut off in the presence of an input pulse, bottomed for a period following an input pulse and cut off for the remainder of the interpulse period.

The source of input pulses can take one of two forms. The source can be of low impedance giving a pulse of voltage independent of the load on the source, in which case the current in the primary winding of transformer T1 increases linearly and the final value is dependent upon the pulse duration which must be adequately controlled.

Alternatively, the source can be of high impedance but in this case the primary winding current would be established very quickly and a high E.M.F. would be induced in the secondary winding of transformer T1. In order to avoid damage to transistor VT1, some limiting action must be provided. Such a voltage limiting action can be provided by a rectifier clamp or by bottoming of a transistor used in the source apparatus. The effect of this limiting action is to establish the required current in transformer T1 without exceeding a safe base-emitter voltage for transformer VT1, the current being independent of the input pulse length provided that the length is adequate to ensure that the required current is established.

The circuit of FIGURE 4 operates in the following manner. In the absence of an input pulse transistor VT1 is cut-off. An amplitude modulated input pulse applied via rectifier W1 establishes a current in the primary winding of transformer T1 and induces an E.M.F. across the secondary winding of the transformer. During the pulse period the base of the transistor is driven to a positive state and the transistor remains cut-off. The rectifier W1 isolates the transformer T1 from the pulse source in the interval between pulses thus ensuring that energy stored in the transformer is dissipated only in transistor VT1.

On cessation of an input pulse, current in the secondary winding of transformer T1 flows in the direction indicated by the arrow in FIG. 4. This current flows from emitter to base and causes the transistor VT1 to conduct. The method of operation is more easily understood on the assumption that the load impedance ZA is a resistor. The magnitude of this resistor is sufficiently large to cause the collector voltage to fall to such an extent that the transistor is bottomed and it will remain bottomed so long as the current flowing in the base circuit is sufficient. The decay of this current is dependent on the voltage drop between emitter and base which in the bottomed condition of transistor VT1 is substantially constant. Thus, the decay of current in the base of transistor VT1 and secondary winding of transformer T1 is substantially linear, being determined by the equation $$v=L\frac{di}{dt}$$

where $v$ is the emitter-base voltage. FIGURE 2 shows the decay of base current. The circuit is arranged so that with maximum input pulse amplitude the base current $I_B$ is sufficient to maintain the transistor VT1 bottomed for a period $T_R$ some 90% of the pulse repetition period. This bottomed condition will cease when $\beta x$ (base current) becomes less than the collector current necessary to bottom the transistor, i.e. when the base current is less than $I_{min.}$ When the input pulse is smaller than the maximum amplitude the current established in the primary of the transformer and hence the base current $I_b$ is correspondingly smaller and since the rate of decay is substantially the same the base current $I_b$ will maintain the bottomed condition of the transistor VT1 for a shorter period $T_r$. The length of the period is proportional to the current established in the primary of the transformer T1, and thus to the amplitude of the input pulse.

The load impedance ZA has some influence on the emitter-base voltage of transistor VT1. This voltage may vary some 10% with the collector current range obtained using a resistor as the collector load. However, this current range may be reduced if the impedance ZA is made inductive. The introduction of such inductance prevents the rapid build up of collector current, as shown in FIG. 3*a*, but leaves the collector voltage, shown in FIG. 3*b*, unchanged. As shown by FIG. 3*c*, the emitter-base voltage would change some 10% during a pulse with a resistor as the collector load but if the load impedance is made inductive the change is reduced. The use of an inductive load thus decreases the variation in emitter-base voltage.

The operation described above is dependent on the emitter to base voltage of the transistor VT1. Variation of this voltage may occur with temperature and may also vary from transistor to transistor. The effect of these variations may be reduced by including a resistor in the emitter circuit. The resistor must be effectively decoupled at the modulation frequencies and its effectiveness increases with the value of the resistor.

The respective input pulses referred to above give rise to pulses at the collector as illustrated by the pulses A and B shown in FIGURE 2. Thus an amplitude modulated pulse at the input of the circuit appears across the output or load resistor RL as a length modulated pulse. The circuit shown in FIG. 4, therefore, provides a means of converting amplitude modulated pulses into length modulated pulses.

FIGURE 1 shows a demodulator circuit suitable for demodulating amplitude modulated pulses having a duration of the order of 1$\mu$s. and with a p.r.f. of the order of $10^4$ p.p.s. This circuit uses only one transistor and is capable of delivering several milliwatts of audio power. The gain of the demodulator is independent of the current gain $\beta$, of the transistor over a wide range. The circuit shown in FIGURE 1 is similar to that shown in FIGURE 4, but in order to provide a demodulator the load impedance ZA of FIGURE 4 is replaced in FIGURE 1 by a low pass filter having a series connected inductor L1 as its first element, the filter having a high impedance above its cut-off frequency.

This filter is driven from a constant voltage supply when the transistor VT1 is conducting; rectifier W2 ensures a low input terminating resistance for the filter when the transistor VT1 is cut-off. The filter should be of the type, well known to filter designers, which operates from a constant voltage and delivers power into a fixed resistor such as R having a value equal to the characteristic impedance of the filter. It can be designed to have a peak of attenuation at the p.r.f. of the input pulses.

The impedance of the filter in the collector circuit of the transistor VT1 has some influence on the emitter to base voltage. The ability of this circuit to produce an audio output which is linearly related to the modulation on the input pulses is dependent on the constancy of the emitter to base voltage. This voltage may vary some 10% with the collector current range which would be obtained with a resistive collector load; however, this current range is reduced when the filter, which has an inductive input impedance is introduced. This inductance prevents the rapid build-up of collector current as shown in FIG. 3*a* but leaves the collector voltage, shown in FIG. 3*b*, unchanged. The emitter to base voltage shown in FIG. 3*c*, which would change some 10% during the pulse with a resistor as the collector load, now takes a different form which has a reduced change during the pulse.

The use of an inductive collector load therefore decreases the variation in emitter to base voltage and thus improves the linearity of the demodulation.

The inductor L1 in the collector circuit also affects the value of $I_{min.}$ shown in FIG. 2. With small amplitude input pulses the maximum collector current is less than with large amplitude input pulses and corresponding changes in $I_{min.}$ occur, the $I_{min.}$ for small inputs being smaller than that for large inputs. This gives a further improvement in linearity.

The input pulses, when unmodulated, will cause a D.C. output to be produced at the output of the filter. This D.C. output can be prevented from flowing into resistor R by connecting a blocking capacitor between the inductor L3 and its junction with resistor R. The direct current may then be used to operate a relay whose coil would be connected across the blocking capacitor and resistor R combination.

This load resistor R may, of course, be replaced by any suitable form of impedance, e.g. a transformer, which terminates the filter with its characteristic impedance.

The circuit shown in FIG. 1 has application in a time division multiplex telephone exchange. In such an application the input to the demodulator may comprise amplitude modulated pulses having a pulse repetition frequency of 10 kc./s. These pulses might consist of pulses of 0.8 $\mu$s. duration and be of 7 volts amplitude with upper and lower limits of modulation of $\pm 3$ volts respectively. Such a pulse could establish a maximum current in the primary of transformer T1, having a primary winding inductance of 1.33 mh., and cause a maximum current of 2 ma. to flow in the base-emitter circuit of transistor VT1, the turns ratio of transformer T1 in this case being 1:3. The decay of this emitter-base current is controlled by the emitter-base voltage, approximately 230 mv., and would fall to 0.2 ma. in 90 $\mu$s.

The collector electrode of transistor VT1 is connected to a 20 volts negative supply and the collector load comprises a low-pass filter having a characteristic impedance of 2.5K ohms. A suitable filter having such a characteristic impedance may be assembled as shown in FIG. 1, the component values then being:

L1=98.0 mh.
L2=19.3 mh.
L3=48.6 mh.
C1=0.1028 $\mu$f.
R=2.5K ohms

The maximum collector current required to bottom the transistor will not exceed 8 ma. This current will be produced with a transistor having a $\beta \geq 40$ when the base current is $\geq 0.2$ ma. The amplitude modulated input pulses will produce length modulated pulses of 20 volts magnitude at the low-pass filter input. The audio power then produced in the terminating resistance R is about 5 mw.

A considerable increase in the audio output power may be obtained by reducing the collector load impedance and increasing the collector current so that the transistor remains bottomed for a longer period. The increased collector power can be obtained by increasing the input current during the pulse. This current has to be established in the primary winding of transformer T1, the inductance of which must therefore be correspondingly decreased. For example, some 50 mw. of audio power can be obtained in the load resistor, by using a 30 volt negative collector supply and injecting 33 ma. into the primary winding of transformer T1 during the input pulse period. The output power for a given input pulse is limited by:

(1) The positive excursion of the emitter-base voltage during an input pulse.

(2) The dissipation in the emitter-base resistance during the period following an input pulse.

(3) The dissipation in the collector while the transistor is bottomed.

In the demodulator described in relation to FIG. 1, the low-pass filter is connected directly in the collector circuit of the transistor VT1 which produces the length modulated pulses. However, the filter need not be so connected and an alternative form of demodulator, embodying the invention, is shown in FIG. 5.

This demodulator comprises a modulation converter which is as the circuit shown in FIG. 4, for converting amplitude modulated input pulses into length modulated pulses. The output of the modulation converter is fed to a pulse amplifier PA of known form. This amplifier amplifies the length modulated pulses which are then fed to the input of a low pass filter (l.p.f.) of known form, demodulated signals appearing across load impedance ZB.

I claim:

1. A circuit for converting amplitude modulated pulses into length modulated pulses, comprising input terminals for connection to a source of amplitude modulated input pulses, a transistor having emitter, base, and collector electrodes, a load impedance connected to the collector electrode, an inductor connected between the base and emitter electrodes, said transistor being cut-off in the absence of input pulses, means connecting the input terminals of the inductor for the duration of each input pulse for establishing a flux in said inductor during each input pulse, the inductance of said inductor being of such value that substantially all the input pulse energy is stored therein during the input pulse, and developing a potential across said inductor proportional to the amplitude of the input pulse and of polarity to maintain said transistor cut-off for the duration of said input pulse, and means isolating said input terminals from the inductor during interpulse periods for causing said flux to commence to collapse immediately upon termination of an input pulse and create a current through said inductor to render said transistor conductive for a period dependent upon the amplitude of the input pulse, the magnitude of said load impedance being such that the transistor is and remains bottomed during its conductive period.

2. The circuit of claim 1, wherein said means connecting the input terminals to the inductor comprises a transformer having said inductor as its secondary winding.

3. The circuit of claim 1, wherein said load impedance is inductive.

4. A circuit for demodulating amplitude modulated pulses, comprising input terminals for connection to a source of amplitude modulated input pulses, a transistor having emitter, base, and collector electrodes, a load impedance connected to the collector electrode, an inductor connected between the base and emitter electrodes, said transistor being cut-off in the absence of input pulses, means connecting the input terminals to the inductor for the duration of each input pulse for establishing a flux in said inductor during each input pulse, the inductance of said inductor being of such value that substantially all of the input pulse energy is stored therein during the input pulse, and developing a potential across said inductor proportional to the amplitude of the input pulse and of polarity to maintain said transistor cut-off for the duration of said input pulse, and means isolating said input terminals from the inductor during interpulse periods for causing said flux to commence to collapse immediately upon termination of an input pulse and create a current through said inductor to render said transistor conductive for a period dependent upon the amplitude of the input pulse, said collector load impedance comprising a low pass filter having input and output terminals, said filter having one of its input terminals connected to said collector electrode and having a series-connected inductor as the first element of said filter, said series-connected inductor being connected to said one input terminal of said filter in series circuit with said filter output terminals, a terminating impedance connected across the output terminals of the filter, the terminating impedance having an impedance of magnitude equal to the characteristic impedance of the filter, and a unilateral conducting device connected across said filter input terminals with polarity to form a low impedance termination of the filter when the transistor is cut-off, the magnitude of the characteristic impedance of the filter being such that the transistor is and remains bottomed during its conductive period.

5. The circuit of claim 4, wherein said means connecting the input terminals to the inductor comprises a transformer having said inductor as its secondary winding.

6. A circuit for demodulating amplitude modulated pulses, comprising input terminals for connection to a source of amplitude modulated input pulses, a transistor having emitter, base, and collector electrodes, a load impedance connected to the collector electrode, an inductor connected between the base and emitter electrodes, said transistor being cut-off in the absence of input pulses, means connecting the input terminals to the inductor for the duration of each input pulse for establishing a flux in said inductor during each input pulse, the inductance of said inductor being of such value that substantially all of the input pulse energy is stored therein during the input pulse, and developing a potential across said inductor proportional to the amplitude of the input pulse and of polarity to maintain said transistor cut-off for the duration of said input pulse, means isolating said input terminals from the inductor during interpulse periods for causing said flux to commence to collapse immediately upon termination of an input pulse and create a current through said inductor to render said transistor conductive for a period dependent upon the amplitude of the input pulse, said collector load impedance comprising a resistor, a pulse amplifier having input terminals and output terminals, means for connecting the pulse amplifier input terminals to the collector load resistor to receive length modulated pulses therefrom, a low pass filter for demodulating length modulated pulses from the pulse amplifier, said filter having input and output terminals, means for connecting the output terminals of the pulse amplifier to the input terminals of the low pass filter, and means connected to the output terminals of the low pass filter for deriving a demodulated output therefrom.

References Cited in the file of this patent

UNITED STATES PATENTS

| | | |
|---|---|---|
| 2,822,520 | Cattermole | Feb. 4, 1958 |
| 2,824,287 | Green et al. | Feb. 18, 1958 |
| 2,900,507 | Rogers | Aug. 18, 1959 |
| 2,996,680 | Barry et al. | Aug. 15, 1961 |